P. D. FLEHR

June 6, 1933. ELECTRICAL CURRENT WAVE CHANGING DEVICE Re. 18,855

Filed Nov. 12, 1925 2 Sheets-Sheet 1

Inventor

Paul D. Flehr

P. D. FLEHR

June 6, 1933. ELECTRICAL CURRENT WAVE CHANGING DEVICE Re. 18,855

Filed Nov. 12, 1925 2 Sheets-Sheet 2

Inventor

Paul D. Flehr

Reissued June 6, 1933 Re. 18,855

UNITED STATES PATENT OFFICE

PAUL D. FLEHR, OF SAN MATEO, CALIFORNIA

ELECTRICAL CURRENT WAVE CHANGING DEVICE

Original No. 1,731,616, dated October 15, 1929, Serial No. 68,503, filed November 12, 1925. Application for reissue filed June 18, 1931. Serial No. 545,361.

This device relates generally to devices for changing the wave form of an electrical current and more specifically to a device for converting the frequency of an alternating current. In the past frequency converters have involved mechanically moving parts or a multiplicity of operators which were impractical from a commercial standpoint. It is an object of this invention to devise a frequency converter which will have no mechanically moving parts, will be simple in construction and have a high electrical efficiency.

It is a further object of this invention to devise novel means for producing a resultant magnetic field from the differential action of a plurality of component magnetic fields.

It is a further object of this invention to devise a frequency converter in which the exciting current whose frequency it is desired to convert is caused to produce a plurality of magnetic fields acting differentially upon each other so as to produce a resultant field which is capable of inducing a current of different frequency from the exciting current. It is a further object of this invention to devise a frequency converter which utilizes a current transformer having a plurality of differentially wound primaries wound upon separate core legs which have different magnetic characteristics.

It is a further object of this invention to devise an efficient form of "A" and "B" battery eliminator which may be used as a source of direct current supply for a vacuum tube system such as employed in radio receiving sets. It is proposed to employ a source of sixty cycle alternating current, convert the frequency of the current to some multiple of sixty, and then rectify and filter the higher frequency. By this method the problem of filtering the rectified alternating current is materially simplified.

Further objects of the invention will appear in the following description in which I have set forth the preferred embodiment of the invention.

Referring to the drawings:—

Figure 1:
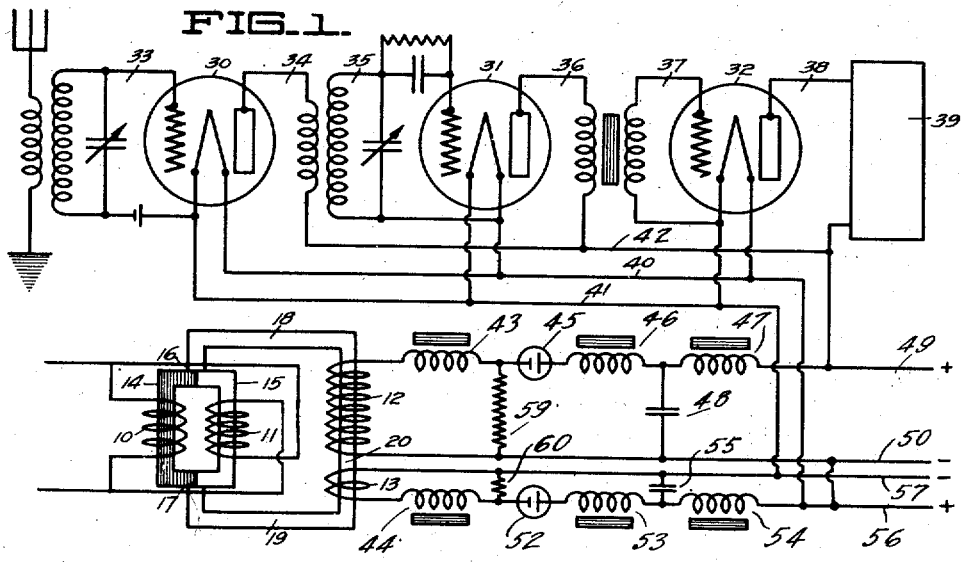
Figure 1 shows a vacuum tube current supply system such as contemplated by this invention.

Referring to Fig. 1, the current wave changing feature of the invention comprises generaly an input circuit including primary coils 10 and 11 and one or more output circuits including secondary coils 12 and 13. These primary and secondary coils are magnetically coupled together somewhat in the same manner as the usual current transformer. When the device is used to convert a given frequency into a higher frequency the primary coils 10 and 11 are connected to a common source of alternating current, preferably in parallel, for example to a source of sixty cycle alternating current.

The means for magnetically coupling together the primary coils with the secondary coils include a plurality of metal core legs 14 and 15 upon which the primary coils 10 and 11 are respectively wound. The corresponding ends of these core legs 14 and 15 are positioned together in juxtaposition and the coils 10 and 11 are so wound that the total effective magnetic field between the points 16 and 17 is produced by the differential effect of the two core legs 14 and 15. Two side legs 18 and 19 are also provided for the purpose of magnetically coupling together the ends 16 and 17 with the leg 20 upon which the secondary coils are wound. Therefore, the magnetic field which tends to induce a current in the secondary coils 12 and 13 is the resultant magnetic field produced by the differential effect of the several magnetic fields produced by the coils 10 and 11.

Figure 2:
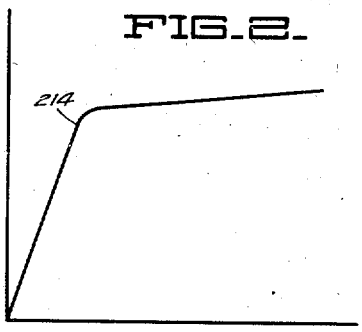
Fig. 2 is a characteristic permeability curve of the material with which one of the core legs is constructed.

The magnetic core legs 14 and 15 are so constructed that their magnetic field characteristics are different. That is, as the exciting current which is put into the device varies between certain limits, the several magnetic fields produced by the core legs 14 and 15 will have different values at different current values. This is preferably accomplished by constructing one of the cores 14 and 15 out of a material which has a different characteristic permeability curve than the material with which the other core or cores is constructed. For example, one of the cores, say the core 14 is constructed of a material which has a permeability curve approximately the curve shown in Fig. 2. In this curve the vertical axis represents permeability, while the horizontal axis represents exciting current. It will be seen from this curve that the particular material selected has a high permeability for relatively small exciting current and also has a flat top characteristic, that is, as the current increases beyond a certain limit, the characteristic curve flattens out or reaches a definite saturation point. The material which I prefer to employ is an alloy of nickel and steel. The characteristics of such a material varies with the percentage of nickel, but the high permeability characteristic for relatively small exciting current is most predominate for an alloy which is known as permalloy which is approximately seventy-eight and one-half percent nickel alloyed with about twenty-two and one-half percent iron.

Figure 3:
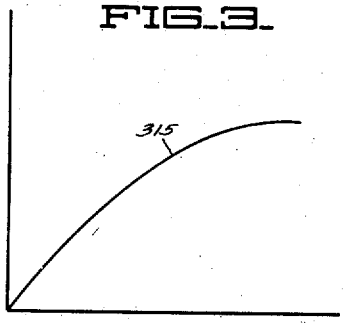
Fig. 3 is a characteristic curve of the material with which one of the other core legs is constructed.

The material with which the core 15 is constructed preferably has a characteristic curve somewhat as shown in Fig. 3. The material of which this curve is a characteristic is the ordinary transformer iron known as high silicon iron. It will be noticed that the charactertistic curve of this material does not reach a definite saturation point until relatively strong exciting currents are employed.

Figure 4:
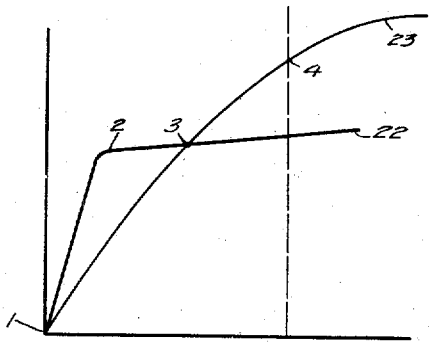
Fig. 4 is a curve showing the characteristics of the separate magnetic fields produced by the differentially wound primary coils.
Figure 5:
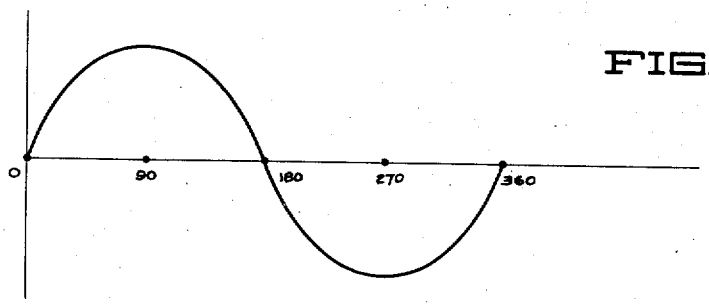
Fig. 5 is a curve showing the usual wave form of sixty cycle alternating current.

As previously mentioned the cross sectional areas and the current in the coils 10 and 11 are so selected that the characteristics of the magnetic field produced by the coils 10 and 11 are approximately as shown in Fig. 4. In this figure the curve 22 represents the characteristic of the total magnetic field produced by the core 14 while the curve 23 represents the characteristic of the total magnetic field produced by the core 15. It will be noted that at the point "1" both of the curves are approximately "0", while at the point "2", the curve 22 predominates. On the other hand at the point "3" the curves intersect and are therefore substantially equal while at the point "4" the curve 23 predominates.

Figure 6:
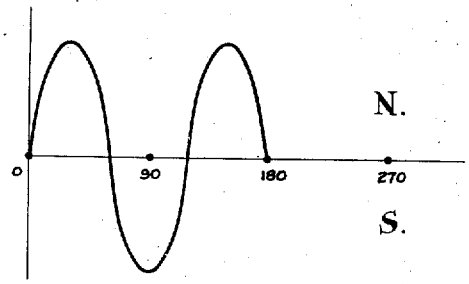
Fig. 6 is a curve showing the characteristics of the total magnetic field produced by the differential action of the primary coils for one-half cycle of the exciting current.

The coils 10 and 11 are so connected together so that the juxtaposed terminals of the cores 14 and 15 are adapted to act differentially upon each other. That is, at the end 16, the opposed end of the cores 14 and 15 will be north and south respectively for a given impulse of current in the input circuit. Now, neglecting the power factor, as the current in the input circuit varies from a zero to a maximum from zero to ninety degrees of the sine wave form, the total resultant magnetic field produced by the two core legs 14 and 15 acting differentially upon each other will vary substantially in accordance to the difference between the two characteristic curves 22 and 23. The horizontal distance to the point "4" represents the maximum magnetization current, which flows in each of the coils. Thus it will be seen as the current rises from a zero value to a maximum value that it passes through a period corresponding to the point "3" where the resultant magnetic field will be zero. On the other hand as the current varies between the points "1" and "3", the resultant field passes through a maximum value of one polarity and as the current varies between the points "3" and "4" it rises to a maximum value of an opposite polarity. Thus, as the exciting current passes through one-half a cycle, that is, from a zero value to a maximum and back again to a zero value at one hundred and eighty degrees, the magnitude and polarity of one of the pole terminals 16 or 17 will vary in accordance with the curve shown in Fig. 6. In this figure, the portion of the curve above the horizontal axis corresponds to a magnetic field of one polarity, while the portions below this section correspond to a magnetic field of opposite polarity. Upon this curve it will be seen that the field at one of the pole terminals will rise to a maximum at three different points as the exciting current passes through one-half a cycle.

Figure 7:
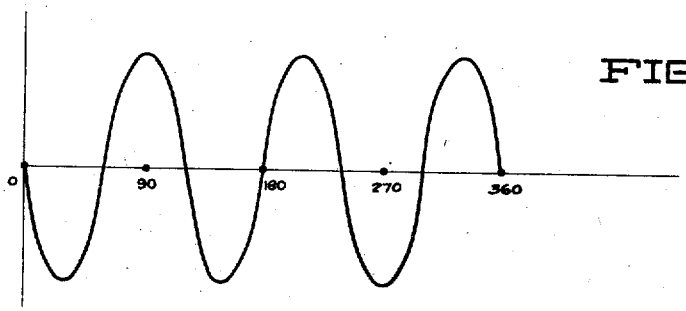
Fig. 7 is a curve showing the wave form of the current in one of the secondary windings of the frequency converter.

Since each of the secondary coils 12 and 13 are magnetically coupled to the transformer legs 18 and 19 with the terminals 16 and 17, it will be seen that current will be induced in these secondary coils in accordance with the differential resultant magnetic field produced by the two primary coils. Thus the current induced in one of the secondary coils will vary in accordance with the curve shown in Fig. 7. From this curve it will be seen that the current induced will pass through one and one-half cycles for every half cycle of the exciting current. Therefore, for every complete cycle of the exciting current, the induced current in one of the secondary coils will pass through three complete cycles, and if the exciting current varies according to a sixty cycle alternating current, then the current in the secondary will be a current of one hundred and eighty cycles which will approximate a sine wave.

In Fig. 1, the frequency converter has been shown as incorporated into a vacuum tube system for supplying the vacuum tube with "A" and "B" battery current. For purposes of illustration three vacuum tubes have been shown in the system, numbered 30, 31 and 32. The first tube, 30, has its input circuit 33 suitably coupled to a source of modulated carrier frequency energy while the output circuit 34 is suitably coupled to the input circuit 35 of the tube 31. The output circuit 36 of tube 31 is suitably coupled to the input circuit 37 of the tube 32, while the output circuit 38 of the tube 32 is suitably connected to a translator or loud speaker 39. The tube 30 has been shown as a radio frequency amplifier, the tube 31 as a detector, and the tube 32 as an audio frequency amplifier. The respective filaments of the tubes are all connected together electrically to the common conductors 40 and 41 while the positive connections for the respective output circuits 34, 36 and 38 are connected together to a common conductor 42.

In order to make the wave form of the current in the respective output coils 12 and 13 more nearly correspond to a true sine wave, the two coils 43 and 44 are inserted. As previously mentioned, the converted frequency current in the secondary coil 12 is employed to supply the "B" battery current for the vacuum tube system. Accordingly means have been provided for rectifying the output current and for filtering the rectified direct current. For this purpose a unidirectional current device or a rectifier 45 is inserted in the circuit and also a filter of the common T type comprising choke or inductance coils 46 and 47 and the parallel condenser 48, is arranged to filter out the ripples in the rectified current. Since these ripples will have a relatively high frequency the problem of filtering and minimizing the ripples will be comparatively simple and the chokes 46 and 47 and the condenser 48 may be relatively small compared to ordinary "B" battery eliminators. The positive and negative output condensers 49 and 50 are connected respectively to the conductor 42 of the output circuit and positive terminal of the "A" battery eliminator.

The output circuit for the secondary coil 13 is correspondingly passed through a rectifier 52 and a filtering device comprising chokes 53 and 54 and parallel condenser 55. The positive and negative output condensers 56 and 57 are connected respectively to the common conductors 41 and 40 of the filaments. One special feature of this arrangement is that the frequency converter not only serves to convert the frequency of the current but also serves to transform the potential of the current so that potential at a relatively high voltage may be supplied for the output of the vacuum tubes while a current at relatively low potential is supplied for energizing the filaments. In order to control and stabilize the wave form of the current in the output circuit the adjustable impedances 59 and 60 are preferably connected in parallel with the respective output circuits of the coils 12 and 13 so that a certain amount of current will always flow in these coils. This causes the current flowing in the coils 12 and 13 to be to a certain extent independent of small fluctuations of current in the output circuit.

While the device is disclosed as a frequency converter for converting the frequency of the exciting current to some multiple of that frequency, it is obvious that it may also be used for reducing the frequency of the exciting current. Thus, if the coil 12 is employed to excite the coils 10 and 11, then the frequency which would result from combining the current in the coils 10 and 11 would be one third the frequency of the exciting current in the coil 12. Furthermore, the device is not to be construed as being limited to a frequency converter. The applicant considers the invention to be sufficiently broad to cover any kind of device coming within the terms of the claims which serve to change the wave form of the exciting current, whether the device is used for merely changing the wave form or for converting the frequency of the exciting current or for rectifying alternating current.

Figure 8:
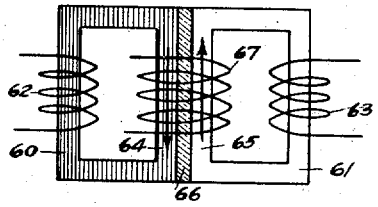
Fig. 8 is a modified form of frequency converter.

In Fig. 8 a modified form of wave changing device is shown in which magnetic interaction is minimized. In this modification, two closed cores 60 and 61 are provided, the magnetic fields of which have characteristics in accordance with the curves 22 and 23 of Fig. 4. The two primary coils 62 and 63 are connected together to a common source of alternating current, preferably in parallel. The core legs 64 and 65 are spaced apart by means of a non-magnetic spacer 66 and a secondary coil 67 is wound about both these legs. Current will therefore be induced in the coil 67 in accordance with the differential effect of the fields of the cores 60 and 61.

What I claim is:

1. The method of altering the wave form of a current comprising causing the current to produce a plurality of magnetic fields having intersecting characteristic filed curves, causing the fields to act differentially upon each other to produce a resultant field, and utilizing the resultant field to excite a current.

2. In a device of the class described comprising means for causing a current of definite wave form to produce a plurality of magnetic fields having different characteristic field curves, said fields being arranged to act differentially upon each other to produce a varying resultant field, and means for causing said resultant field to induce a current of different wave form in an output circuit.

3. In a frequency converter, an input coil and an output coil, means for magnetically coupling together said coils, and means for modifying said magnetic coupling including a plurality of magnet cores made of materials having different permeability characteristics.

4. In a wave form changing device, an input circuit including at least two differentially wound primary coils, an output circuit including a secondary coil, and means for magnetically coupling together said coils including a core for each primary coil of different permeability characteristics and arranged to act differentially upon each other.

5. In a wave form changing device, an input circuit including at least two primary coils, a core for each primary coil, said coils and cores being so selected that the characteristic curve of the field of one core is different from that of the other core, an output circuit including a secondary coil, and means for coupling together the secondary coil and the primary coils whereby the resultant field produced by the said cores will induce the output current.

6. In a wave changing device, a transformer having at least two primary windings and a secondary winding, separate magnetic core legs for said primary coils, said core legs being made of dissimilar materials having different permeability characteristics.

7. Means for forming a resultant magnetic field comprising a pair of relatively stationary magnetic cores, and separate windings upon each of said cores adapted to be electrically excited, said cores being physically positioned with respect to each other whereby the component fields of said cores are in opposition, one of said cores being adapted to reach saturation at an exciting current value substantially less than the current value necessary to saturate the other core.

8. Means for forming a resultant magnetic field, comprising at least two relatively stationary electromagnetic elements, means for electrically exciting said elements whereby two component magnetic fields are formed, said elements having different characteristic magnetization curves and having their component fields acting in opposition to form said resultant field.

9. Means for forming a resultant magnetic field, comprising at least two relatively stationary electromagnetic elements, means for electrically exciting said elements whereby two component magnetic fields are formed, said elements having characteristic magnetization curves which intersect in at least two spaced points, and means for combining said component fields to form a resultant field.

10. In a device for forming a resultant magnetic field which varies disproportionately with respect to its exciting current, a pair of relatively stationary magnetic cores made of different materials having different permeability characteristics, and windings upon said cores, said cores being physically arranged to form a resultant field by the combined action of their fields.

11. Means for forming a resultant magnetic field comprising at least two relatively stationary magnetic cores, said cores being made of materials having different permeability characteristics, and means for magnetizing each of said elements whereby two component magnetic fields are formed, said cores being magnetically interrelated whereby their component fields act in opposition to form said resultant field.

12. A transformer comprising a pair of cores of magnetic materials having substantially different permeability characteristics, windings upon each of said cores, another magnetic core magnetically related to both of said first mentioned cores, and a winding on said last mentioned core.

13. A transformer comprising a pair of cores of magnetic material, one of said cores being made of a nickel iron alloy capable of relatively high magnetization under small magnetizing currents, another core of ordinary iron, a winding upon said latter core, another magnetic core magnetically related to both said first named cores, and a winding upon said last named core.

14. The method of forming a resultant magnetic field characterized by the use of two distinct core materials having different permeability characteristic curves adapted to be magnetized by varying current in an exciting circuit, said method comprising combining the component fields of said materials to form a resultant field, magnetizing both of said materials below saturation for relatively small current values, and magnetizing one of said materials beyond saturation while the other material is below saturation for higher current values.

15. A method characterized by the use of two distinct core materials having different permeability characteristics and which magnetically intercouple primary and secondary windings, the former of these windings being supplied with varying current from an exciting circuit and the latter of these windings suplying an output circuit; said method comprising combining the component fields of said materials to form a resultant flux magnetizing both of said materials below saturation for small current values in the exciting circuit, magnetizing one of said materials beyond saturation while the other material is below saturation for higher current values, and utilizing the combined flux from said materials for inducing current in the secondary winding.

16. In a transformer, primary winding means, a secondary winding means, and magnetic path intercoupling said primary and secondary means, one part of said path being formed of magnetic material having high magnetization for relatively small magnetizing current, and another part of said path being formed of magnetic material having substantially lower magnetization for the same magnetizing current.

17. In a transformer, primary winding means, a secondary winding means and a magnetic path intercoupling said primary and secondary means, one part of said path being formed of a nickel iron alloy having relatively higher magnetization for a given magnetizing current than ordinary iron, and another part of said path being formed of ordinary iron.

18. In a device of the character described, a flux modifying assembly including in combination a multi-part core, a winding on said core, parts of said core being formed of magnetic materials having different permeability characteristics, one part thereof having a high initial permeability and low saturation as compared with silicon iron while another part thereof has permeability characteristics similar to that of silicon iron.

19. In an electrical device, winding means adapted to be excited by an alternating current supply, composite magnetic core means serving to form a resultant magnetic field of predetermined characteristics, said core means including two different magnetic materials having intersecting characteristic permeability curves, and means adapted to be excited by said resultant field.

20. In an electrical device, winding means adapted to be excited by alternating current supply lines, composite magnetic core means serving to form a resultant magnetic field of predetermined characteristics, said core means including a nickel iron alloy part having relatively high magnetization for small magnetizing forces and another part of ferro-magnetic material having a relatively lower magnetization for small magnetizing forces but greater magnetization for relatively large magnetizing forces, and means adapted to be excited by said resultant field.

In testimony whereof, I have signed my name to this specification.

PAUL D. FLEHR.